United States Patent
Maas et al.

(10) Patent No.: US 7,518,121 B2
(45) Date of Patent: Apr. 14, 2009

(54) METHOD FOR DETERMINING LENS ERRORS IN A PARTICLE-OPTICAL DEVICE

(75) Inventors: Diederik Jan Maas, Breda (NL); Sjoerd Antonius Maria Mentink, Eindhoven (NL); Jeroen Jan Lambertus Horikx, Eindhoven (NL); Bert Henning Freitag, Eindhoven (NL)

(73) Assignee: Fei Company, Hillsboro, OR (US)

( * ) Notice: Subject to any disclaimer, the term of this patent is extended or adjusted under 35 U.S.C. 154(b) by 398 days.

(21) Appl. No.: 11/512,806

(22) Filed: Aug. 30, 2006

(65) Prior Publication Data

US 2007/0045558 A1 Mar. 1, 2007

(30) Foreign Application Priority Data

Sep. 1, 2005 (NL) .................................... 1029847

(51) Int. Cl.
*G21K 1/08* (2006.01)
(52) U.S. Cl. ................... 250/396 R; 250/398; 250/397; 250/307
(58) Field of Classification Search . 250/396 R–396 MI
See application file for complete search history.

(56) References Cited

U.S. PATENT DOCUMENTS

| | | | | |
|---|---|---|---|---|
| 3,993,905 A | * | 11/1976 | Mollenstedt | ................. 250/310 |
| 4,144,488 A | * | 3/1979 | Haas et al. | ................... 324/751 |
| 4,200,794 A | * | 4/1980 | Newberry et al. | ..... 250/396 ML |
| 6,426,501 B1 | | 7/2002 | Nakagawa | |
| 2005/0133718 A1 | | 6/2005 | Atsushi | |
| 2006/0231774 A1 | * | 10/2006 | Storm et al. | ............. 250/492.3 |

OTHER PUBLICATIONS

Mitrofanov A.V. et al, INSPEC/IEE, 1992.
Guiton Beth J. et al. "Single-Crystalline Vanadium Dioxide Nanowires with Rectangular Cross Sections" J. AM. Chem Soc. 2005, 127, 498-499pp.
Canemco "Scanning Electron Microscopy Supplies" webpages www.canemco.com 1-33pp.
Carson, K.R et al "An Improved Standard Specimen for Alignment of Electron Microscopes" J. Sci. Instrum., 1967 vol. 44, 1036-1037.
Krohn, V.E., et al. "Ion Source of High Brightness Using Liquid Metal" Applied Physics Letters, vol. 27, No. 9, Nov. 1, 1975 479-481.

(Continued)

*Primary Examiner*—Jack I Berman
*Assistant Examiner*—Andrew Smyth
(74) *Attorney, Agent, or Firm*—Scheinberg & Griner, L.L.P.; Michael O. Scheinberg; David Griner

(57) ABSTRACT

The invention relates to a method for determining lens errors in a Scanning Electron Microscope, more specifically to a sample that enables such lens errors to be determined. The invention describes, for example, the use of cubic MgO crystals which are relatively easy to produce as so-called 'self-assembling' crystals on a silicon wafer. Such crystals have almost ideal angles and edges. Even in the presence of lens errors this may give a clear impression of the situation if no lens errors are present. This enables a good reconstruction to be made of the cross-section of the beam in different under- and over-focus planes. The lens errors can then be determined on the basis of this reconstruction, whereupon they can be corrected by means of a corrector.

21 Claims, 2 Drawing Sheets

OTHER PUBLICATIONS

Figure 1:
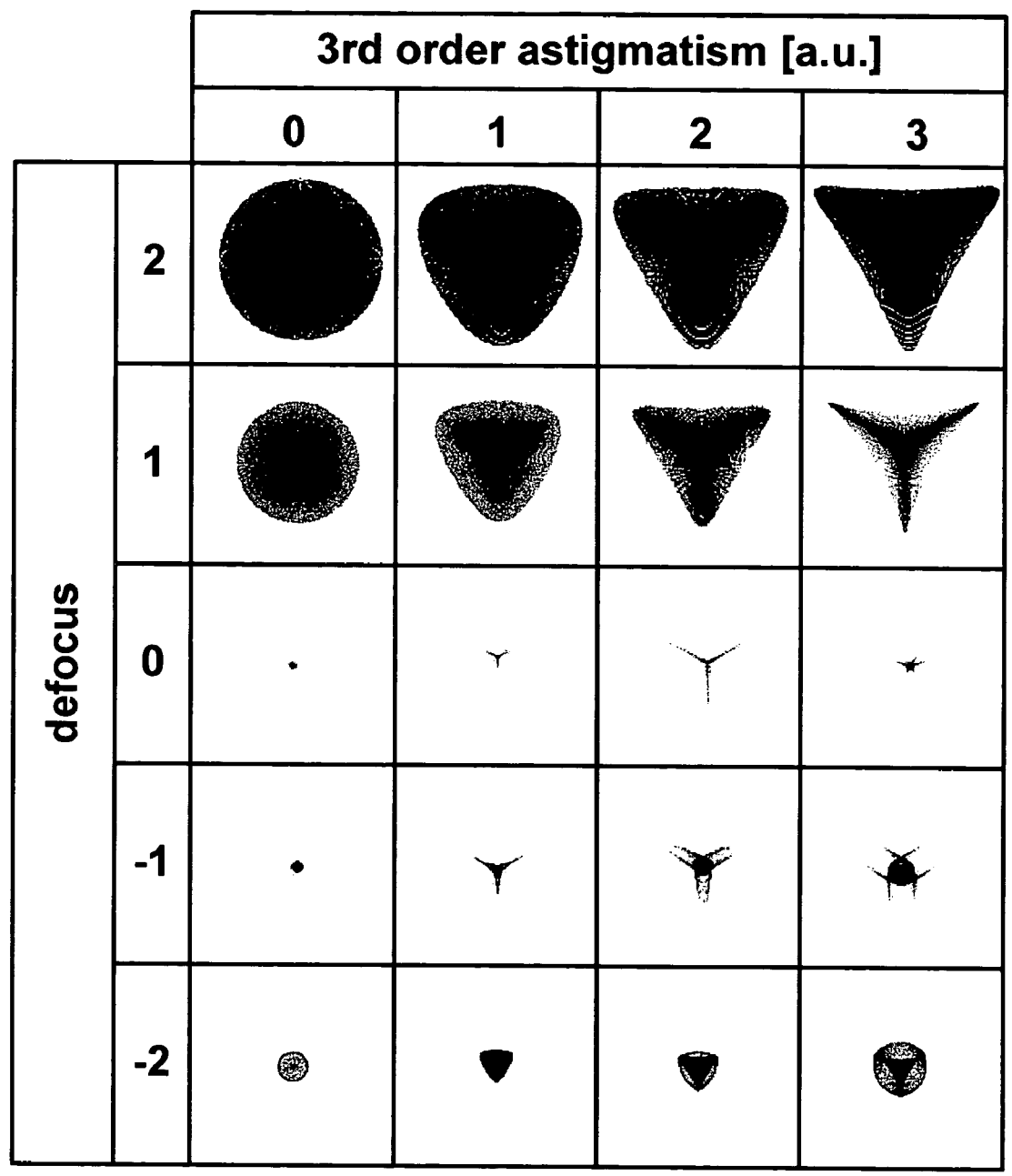

Ohnishi Tsuyoshi, et al. "Development of an FIB System using a Ga-In-Sn- LMIS" Central Research Laboratory, Hitachi Ltd.,101-104.

Bernhard, W. "Erpobung eines spharisch and chromatisch korrigierten Elektronenmikroskopes" OPtik 57, No. 1(1980) 73-94.

Hashimoto et al., Pseudo-aberration Free Focus Condition for Atomic Resolution Electron Microscope Images, Micron, 1998, vol. 29, No. 2-3, pp. 113-121.

Hibi et al., On a Slit for Objective Electron Lens, Research Institute for Scientific Measurements, 1954, vol. 6, pp. 511-516.

Jones et al., An Apparatus for Determining the Secondary Electron Emission Properties of Nonconductors, Journal of Physics E. Scientific Instruments, Dec. 1, 1970, vol. 3, No. 12, pp. 997-999.

Joy, D.C., SEM Parameters and their Measurement, Scanning Electron Microscopy, 1974, pp. 327-334.

\* cited by examiner

METHOD FOR DETERMINING LENS ERRORS IN A PARTICLE-OPTICAL DEVICE

The invention relates to a method for determining lens errors in a particle-optical device, which device is designed to scan a sample with a focused particle beam, comprising
the supply of a sample with parts having a known shape,
the production of one or more images of the sample by scanning the sample with the particle beam, and
a determination of the cross-section of the beam on the basis of the image(s) produced.

Samples for such a method are known from the catalogue "Scanning Electron Microscopy Supplies" from Canemco, (821 B McCaffrey St., St. Laurent, (Montreal) Quebec, Canada. H4T 1 N3), page 29 ("Low Voltage Resolution Tin on Carbon"), available on the Internet on 25 Aug. 2005 (http://www.canemco.com/catalog/sem/Canemco_Scanning.pdf).

This method is used with particle-optical device such as the SEM (Scanning Electron Microscope), STEM (Scanning Transmission Electron Microscope) and FIB (Focused Ion Beam) devices.

Particle-optical devices of the above-mentioned type are used, for example, in the semiconductor industry for the inspection, analysis and modification of samples.

SEM and STEM devices are used for inspecting and analysing samples. Here a sample to be examined is scanned by a focused particle beam. This particle beam is a beam of electrons, which beam is focused on the sample with an object lens. The focus of the beam on the sample has a diameter of e.g. 1 nm. The beam is scanned over the sample, as a result of which (spatially dependent) information is released, e.g. in the form of secondary electrons. This information is detected and made available in the form of an image of the sample.

FIB devices use a focused ion beam which is scanned over the sample. The ion beam may cause the material of the sample to be etched away or the material to be merely deposited on the sample. The effect of the ion beam is also determined by the composition of the sample and by gases which are allowed in the vicinity of the sample. Moreover, (spatially dependent) information is released, e.g. in the form of secondary electrons. This information can be detected and can be made available in the form of an image of the sample.

It should be pointed out that an electron beam can cause etching or deposition due to gases in the area surrounding the sample.

Such devices frequently display astigmatism (or more precisely: astigmatism of the $1^{st}$ order). In the case of astigmatism of the $1^{st}$ order the beam has two mutually perpendicular line foci. One line focus may be represented on the sample by a slight under-focus of the object lens, and the other line focus can be represented on the sample by a slight over-focus of the object lens.

Exactly between the line foci, where the focus of the beam is located, the resolution will be poorer than if there is no astigmatism, since the diameter of the beam is at least half the length of each of the line foci at that point.

It should be pointed out that such devices are in most cases equipped with a corrector in the form of a stigmator for correcting the astigmatism, which stigmator brings the two line foci together so that a point focus is formed.

In the method of prior art a sample is used in the form of tin balls on a carbon substrate in order to determine the presence of astigmatism. Such tin balls approach the ideal spherical shape to a large degree, as described in "An improved standard specimen for alignment of electron microscopes", K. R. Carson et al 1967 *J. Sci. Instrum.* 44 1036-1037, where a method is described for the manufacture of such samples.

The tin ball form of prior art makes it possible, when they are viewed in a particle-optic device such as an electron microscope, to see easily whether the beam displays astigmatism. Due to the prior art shape of the tin balls a perfectly round image of the tin balls is expected, the sharpness of the edge of the image being the same throughout. However, for the orientations where the line focus touches the circumference of the tin ball tangentially, a sharp image will be obtained, but where the line focus touches the circumference of the tin ball radially, a lack of sharpness will occur, amounting to the length of the line focus. A sharp image is in this case understood to be an image with a resolution that is obtained without astigmatism.

By now varying the excitation of the stigmator, whilst repeatedly focussing and slightly defocusing the object lens, until no further astigmatism can be shown, the astigmatism is corrected.

One disadvantage of the tin balls of prior art is that the size according to the known catalogue is no smaller than 10 nm, whereas most tin balls have a much larger diameter. Where the resolution to be obtained is 1 nm, for example, as can today be achieved with an SEM, it is not easily possible to remove all astigmatism by means of such a sample.

A further disadvantage of the tin balls of prior art is that they do not lend themselves well to determining other lens errors, e.g. astigmatism of the $3^{rd}$ order or coma. These errors give rise to a cross-section of the beam (i.e. a section that is perpendicular to the optical axis of the lens) in which the magnification has a greater degree of symmetry than in the case of astigmatism of the $1^{st}$ order. Astigmatism of the $3^{rd}$ order, with a certain degree of under- and overfocus, for example, gives rise to a beam cross-section that is equal to a triangle, whilst the combination of spherical aberration and $3^{rd}$ order astigmatism, even in focus, has a triangular cross-section. Consequently there will be no sharp image of a tin ball in any direction, which makes it difficult to determine the lens errors.

An overview of beam diameters caused by different lens errors is given in "Erprobung eines sphärisch und chromatisch korrigierten Elektronenmikroskopes" (Testing of a spherically and chromatically corrected electron microscope), W. Bernard, Optik 57 (1980), pages 73-94, in particular page 83.

It should be noted that the beam diameter of a beam which suffers from several errors is not necessarily a summation of the beam diameter of each of the errors. Spherical aberration and $3^{rd}$ order astigmatism give rise, each separately in the focal plane, a rotation symmetrical beam diameter. However, as will be shown later in the figures, a combination of spherical aberration and $3^{rd}$ order astigmatism in the focal plane, for example, gives rise to a beam diameter with a triangular cross-section.

The object of the invention is to provide a method whereby the shape of the sample lends itself to more accurate determination of lens errors than the method of prior art.

For this purpose the method according to the invention is characterised in that the sample is a crystalline sample with a free edge, which edge is formed by a mono-crystal.

The invention is based on the realisation that the image of the sample is the convolution of an error-free image of the sample on the one hand and the actual diameter of the beam on the other. By now representing the sample parts with known angles and/or sharp edges, an accurate estimate can be made of the image as it should appear if it were to be represented with a beam having an ideal focus. This enables the shape of the beam to be determined by deconvolution, which in turn makes it possible to determine the lens errors. A mono-crystal frequently has the required parts as sharp edges and known angles.

An additional advantage is that consequently it is not so much the shape and size of the entire sample that is important, but rather that of only individual parts of the sample, for example the angles of the sample. It is therefore still possible to represent parts which have a radius of less than one nanometer with a sample having a dimension of over 10 nm, for example.

It should be noted that it is possible to use samples which lie on a substrate of silicon or carbon, for example, but also samples which are partially embedded in a substrate, as well as samples in which parts of the sample lie free in relation to the substrate.

It should also be noted that (arts of) mono-crystals are also understood to mean nanotubes and nanowires, for example, as described for instance by Guiton et al., J. Am. Chem. Soc. 127 (2005), pp 498-499.

In an embodiment of the method according to the invention the crystalline sample is a mono-crystal.

In this embodiment the entire sample is a mono-crystal, and all the sides and corners have the sides and corners that characterise a mono-crystal. If the image of the crystal is now viewed, the cross-section of the beam can be accurately established.

In another embodiment of the method according to the invention, the mono-crystal has right angles.

In a shape with right angles, slight out of roundness of the beam diameter will result in a clearly differentiated image of said angles. Very small deviations from the beam diameter can already be observed, particularly if such a sample is viewed perpendicular to a plane of the sample, the shape observed therefore being a rectangle.

It should be noted that in order to have a shape with right angles, it is necessary for the mono-crystal to have a crystal lattice in which the angles of the lattice are right angles. Such crystal lattices are also referred to as tetragonal, ortho-rhombic or cubic. However, it is not the case that every mono-crystal with such a crystal lattice has a shape with right angles. A cubic mono-crystal may also have a hexagonal, tetrahedral or dodecahedral shape, for example.

In a further embodiment of the method according to the invention the mono-crystal is a salt crystal.

The image of a particle beam device is often produced on the basis of the quantity of secondary electrons that are released in response to the beam incident particles. The average quantity of secondary electrons which are released in response to one incident particle is known as the secondary emission coefficient. When scanning with an electron beam, salt crystals frequently have a secondary emission coefficient>2, from low beam energies of less than 200 eV to high beam energies of over 100 keV, for example. Commonly used substrates, such as carbon or silicon, have a low secondary emission coefficient at these different particular energies, so that a sharp contrast between sample and substrate is obtained. Salt crystals may therefore be used for a wide range of beam energies.

In yet another embodiment, the salt crystal consists of magnesium oxide.

Magnesium oxide is a salt that can easily be formed, so that has crystal with right angles.

A further advantage is that magnesium oxide mono-crystals of a small dimension can easily be formed on a substrate such as a silicon wafer by moving the wafer through the flame of a burning magnesium strip. In this case magnesium cubes and bars are formed which are aligned to the wafer surface: these are so-called "self-assembling structures". By selecting the incidence of the particle beam perpendicular to the substrate, only one plane will be represented as a result of this alignment, which plane is a right angle. This enables the beam shape to be determined relatively easily with the aid of computer techniques, for example. These samples therefore lend themselves to determining various errors of the beam, such as astigmatism of the $3^{rd}$ order and coma.

Another advantage of cubic crystals with such an orientation is that the lateral surfaces of the sample (i.e. the planes of the sample adjacent to the observed plane) are not exposed by the beam at all, so that the ribs that determine the aforementioned angles can be established very clearly.

In yet another embodiment of the method according to the invention the mono-crystal has a maximum dimension of 100 nm.

The use of so-called nanocrystals, by which are meant mono-crystals with a maximum dimension of less than 100 nm, for example, is attractive because the size of these monocrystals does not differ by many orders of magnitude from the diameter of the beam with which the mono-crystal is scanned. It is therefore possible, with the reproduction techniques currently used, in which e.g. 1000*1000 pixels are represented, to represent the entire sample when at the same time the beam diameter occupies several pixels. The latter is necessary to be able to determine the beam shape with sufficient accuracy.

In yet another embodiment of the method according to the invention, the sample is placed on a substrate, wherein the secondary emission coefficient of the substrate and sample differs considerably.

It should be clear that it is necessary for the secondary emission coefficient of the substrate and sample to be different. Because of this substantial difference, a high contrast between the sample and substrate is achieved.

In yet another embodiment of the method according to the invention the sample is placed on an electrically conducting material.

Besides lens errors, charges of the sample may also give rise to distortion of the image. It would then be unclear whether the distortions are the result of charging or a result of lens errors. By now placing the sample on a conducting substrate, charging is prevented as much as possible.

In yet another embodiment of the method according to the invention the particle optical device is provided with a corrector for lens errors, which corrector is amplified by means of the lens error determination obtained, so that the lens errors are reduced.

Figure 2:
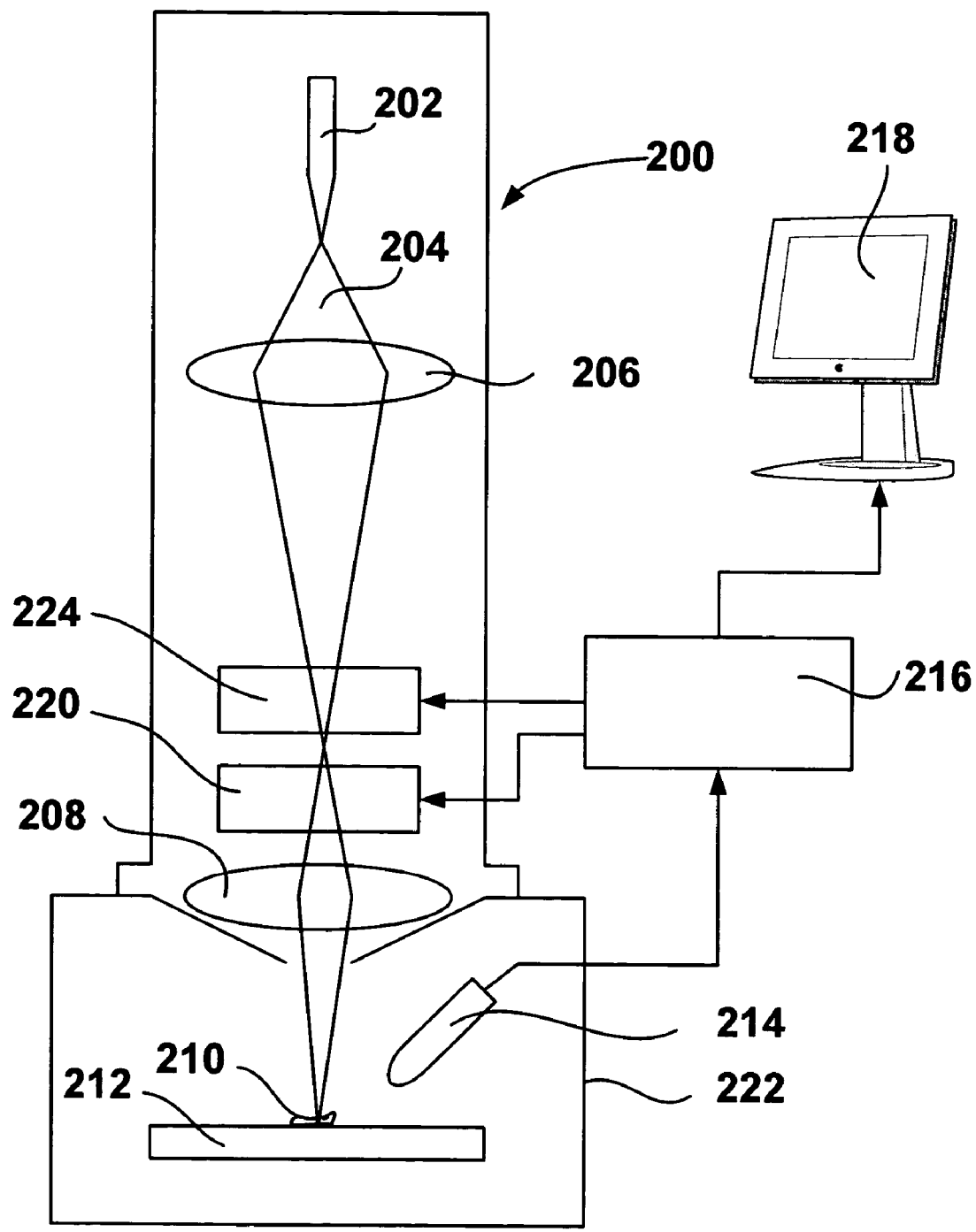

The invention is now explained in further detail with reference to two figures, where:

FIG. 1 schematically shows the cross-section of the beam at different distances from the (paraxial) focal plane, as calculated with computer simulations, and FIG. 2 schematically shows a device for implementing the method according to the invention.

FIG. 1 schematically shows the cross-section of the beam at different distances from the (paraxial) focal plane, as calculated with computer simulations.

In this simulation the beam suffers in all cases from the same degree of spherical aberration. The rows show the cross-sections at different degrees of defocus, and the columns show the sections at different values of $3^{rd}$ order astigmatism.

The focal plane is indicated in the $3^{rd}$ row, at defocus=0. The $2^{nd}$ row indicates the cross-sections of the beam in a plane which, viewed from the object lens, has been placed a certain distance behind the focal plane, whilst the $1^{st}$ row reproduces the cross-sections of the beam in a plane located at the same distance behind it. Similarly, the $4^{th}$ and $5^{th}$ rows show cross-sections of the beam in planes which lie between the parallax focal plane and the object lens.

In the $1^{st}$ column, on the far left, no $3^{rd}$ order astigmatism is present and the beam only suffers from spherical aberration. In the $2^{nd}$ column, a certain degree of $3^{rd}$ order astigmatism is present in addition to the same spherical aberration as is present in column 1. In the $3^{rd}$ column, in addition to the spherical aberration, $3^{rd}$ order astigmatism is present which is twice as great as that in the $2^{nd}$ column. In the $4^{th}$ column, in addition to the spherical aberration, $3^{rd}$ order astigmatism is present which is 3 times larger than in the $2^{nd}$ column.

As is known to the person skilled in the art, spherical aberration gives rise to a beam diameter which is rotation symmetrical about the axis of the lens. However, $3^{rd}$ order astigmatism causes an asymmetrical beam diameter with a triple symmetry. It is clearly seen that as $3^{rd}$ order astigmatism increases, so the beam diameter becomes increasingly less rotation symmetrical.

By determining the beam shape for different defocus distances, it will be possible to determine the lens error with suitable metrics. Although spherical aberration and $3^{rd}$ order astigmatism are used as lens errors in this example, it will be clear that other lens errors can also be determined in this way.

As shown earlier, the image of the sample is the convolution of the image that would be formed if the sample were to be scanned with a beam of infinitely small diameter and the actual diameter of the beam. By determining the position and orientation of ribs of the sample structures, for example, on the basis of the image obtained (which is a convolution of the sample and the beam shape), the shape of the sample can be reconstructed.

As is known to the person skilled in the art, a deconvolution of the image can then be carried out with the reconstructed shape of the sample, which gives a reconstruction of the beam diameter at a certain distance from the focus.

By carrying out this reconstruction of the beam diameter at different defocuses, the beam shape can be determined, whereupon the lens errors can be determined by intrinsically known methods. The excitation of the corrector can then be varied, manually or controlled by a computer, so that the lens errors are reduced. This process may be repeated several times, for example, until the lens errors are smaller than a pre-established value, or until the beam diameter in the focus has a value that is smaller than the pre-established value.

FIG. 2 schematically shows a device for implementing the method according to the invention.

An electron column 200, such as an SEM (Scanning Electron Microscope) contains an electron source 202 which generates an electron beam 204. This electron beam 204 is focused on a sample position 210 by lenses such as magnetic lenses, 206 and 208. This sample position 210 is placed on a displacement table 212 in order to move the area to be inspected from a sample to the focus of electron beam 204. Electron beam 204 is scanned over the surface of a sample placed in sample position 210 by deflector 220 under the control of a central control unit 216. When electron beam 204 is scanned over the sample placed in sample position 210, secondary electrons are released which are detected by means of a secondary electron detector (SED) 214. These secondary electrons therefore provide spatially dependent information on the sample. The signal from SED 214 is transmitted to central control unit 216, which converts this spatially dependent signal to a signal for a monitor 218, whereupon the user obtains an image of the sample. SED 214, displacement table 212 and sample position 210 are located in a sample chamber 222. Both electron column 200 and sample chamber 222 are retained in a vacuum during operation of the device by evacuation means not shown.

A corrector 224, which corrector contains a plurality of electrical and/or magnetic multipoles, for example, as is known to the person skilled in the art, is amplified by central control unit 216 for reducing the effect of lens errors caused by lens 206.

In order to establish the correct excitation for the corrector 224, a mono-crystal of magnesium oxide, for example, is placed on a substrate of carbon or silicon in sample position 210. By then carrying out the method according to the invention, the correct excitation can be found for corrector 224. A sample to be examined can then be brought into the sample position, whereupon this sample can be examined.

We claim as follows:

1. A method for determining lens errors in a particle-optical apparatus, which apparatus is designed to scan a sample with a focused particle beam, comprising:
   the supply of a sample with parts having a known shape,
   the production of one or more images of the sample by scanning the sample with the particle beam, and
   a determination of the cross-section of the beam on the basis of the image or images produced,
characterized in that
   the sample is a crystalline sample with a free edge, which edge is formed by the edge of a mono-crystal.

2. The method according to claim 1, wherein the crystalline sample is a mono-crystal.

3. The method according to claim 1, wherein the mono-crystal has right angles.

4. The method according to claim 3, wherein the mono-crystal is a salt crystal.

5. The method according to claim 4, wherein the salt crystal is a mono-crystal of magnesium oxide.

6. The method according to claim 1, wherein the mono-crystal has a maximum dimension of 100 nm.

7. The method according to claim 1, wherein the sample is placed on a substrate, and wherein the secondary emission coefficients of the substrate and sample differ substantially.

8. The method according to claim 1, wherein the sample is placed on an electrically conducting substrate.

9. The method according to claim 1, wherein the particle optical apparatus is provided with a corrector for lens errors, which corrector is excited according to the determined cross-section of the beam, so that lens errors are reduced.

10. A method for determining lens errors in a particle-optical apparatus, which apparatus is designed to scan a sample with a focused particle beam, comprising:
    supplying a sample, an edge of the sample being formed by a mono-crystal,
    producing one or more images of at least a portion of the sample including the edge by scanning the portion of the sample with the particle beam, and
    determining a lens error of the particle beam using the one or more image or images produced.

11. The method according to claim 10 further comprising applying a voltage to a corrector of the charged particle beam apparatus to reduce the lens error.

12. The method according to claim 10, wherein the mono-crystal includes at least two faces forming a right angle with each other.

13. The method according to claim 10, wherein the entire sample comprises a mono-crystal.

14. The method according to claim 10, wherein the mono-crystal is a salt crystal.

15. The method according to claim 14, wherein the salt crystal is a mono-crystal of magnesium oxide.

16. The method according to claim 10, wherein the mono-crystal has a maximum dimension of 100 nm.

17. The method according to claim 10, wherein the sample is positioned on a substrate, and wherein the secondary emission coefficients of the substrate and sample differ substantially.

18. The method according to claim 10, wherein the sample is placed on an electrically conducting substrate.

19. The method according to claim 10, wherein determining the lens errors of the beam using the image or images produced includes determining the beam shape by reconstructing the beam diameter at different levels of defocuses.

20. The method according to claim 10, wherein supplying a sample, an edge of the sample being formed by a mono-crystal, includes supplying a nano-tube or a nanowire.

21. The method according to claim 10, wherein supplying a sample includes supplying a self-assembled structure on a silicon substrate.

* * * * *